United States Patent [19]
Todoroki et al.

[11] Patent Number: 5,272,360
[45] Date of Patent: Dec. 21, 1993

[54] THIN FILM TRANSISTOR HAVING ENHANCE STABILITY IN ELECTRICAL CHARACTERISTICS

[75] Inventors: Satoru Todoroki; Masahiro Tanaka, both of Yokohama; Kunihiko Watanabe, Fujisawa; Mitsuo Nakatani, Yokohama, all of Japan

[73] Assignee: Hitachi, Ltd., Tokyo, Japan

[21] Appl. No.: 662,635

[22] Filed: Feb. 28, 1991

[30] Foreign Application Priority Data

Feb. 28, 1990 [JP] Japan .................................. 2-48566
Mar. 19, 1990 [JP] Japan .................................. 2-67001

[51] Int. Cl.$^5$ .................... H01L 27/01; H01L 27/13; H01L 29/78
[52] U.S. Cl. .................................. 257/60; 257/410; 257/411; 257/640; 257/649
[58] Field of Search .................... 357/23.7, 54; 257/57, 257/60, 66, 410, 411, 640, 649

[56] References Cited

U.S. PATENT DOCUMENTS

| | | | |
|---|---|---|---|
| 4,933,206 | 6/1990 | Cox | 427/558 |
| 5,045,487 | 9/1991 | Kodama et al. | 357/23.7 |
| 5,051,800 | 9/1991 | Shoji et al. | 357/23.7 |

FOREIGN PATENT DOCUMENTS 62-71276  4/1987  Japan.

*Primary Examiner*—Sara W. Crane
*Attorney, Agent, or Firm*—Antonelli, Terry Stout & Kraus

[57] ABSTRACT

A microwave plasma enhanced CVD method and apparatus wherein a microwave is applied, after expanded, over a greater area than the area in which a desired thin film is to be formed. With this arrangement, uniform microwave application is assured to produce uniform plasma over a wide area. This enables realization of a large size liquid crystal display.

3 Claims, 7 Drawing Sheets

THIN FILM TRANSISTOR HAVING ENHANCE STABILITY IN ELECTRICAL CHARACTERISTICS

BACKGROUND OF THE INVENTION

1. Field of the Invention

The present invention relates to a method and an apparatus for forming a thin film utilizing microwave plasma enhanced CVD, and more particularly to a method and an apparatus utilizing the microwave plasma enhanced CVD which is capable of forming a thin film of a large size with uniformity. The present invention further relates to a gas feeding, method and apparatus suitable for the microwave plasma enhanced CVD.

2. Description of the Related Art

In recent years, a liquid crystal display unit having a large display area has been developed and come to be used widely. Such a liquid crystal display unit comprises a panel in which a number of thin film transistors each comprising an amorphous silicon thin film are arranged in a matrix form.

FIG. 6 illustrates, in an enlarged scale, a conventional thin-film transistor as disclosed, for example, in Japanese Unexamined Patent Publication (KOKAI) No. 58-114453. The thin-film transistor comprises a gate electrode 11 formed in a desired position on a transparent glass 10 as a substrate, a gate insulation film 12 formed so as to cover the gate electrode 11, an amorphous silicon i layer 13 formed on the gate insulation film 12, a metal 14 for a Schottky barrier formed in a part of the periphery of the gate insulation film 12 and amorphous silicon i layer 13, a source electrode 15, a drain electrode 16 which covers the periphery of the gate insulation film 12, amorphous silicon i layer 13 and metal 14 and has an opening formed on the entire outside thereof, a passivation film 17 formed on the opening, and a flag film 18 formed on the passivation film 17.

The amorphous silicon i layer 13 and the gate insulation film 12 are formed by using a conventional plasma CVD method and apparatus. According to this method, the substrate is heated to a temperature as high as 250°-350° C. for the desired film deposition. For this reason, the materials of the substrate or other underlayers are limited. In addition, there is a problem of diffusion of impurities. The conventional method involves a further problem that the decomposition or utilization efficiency of a material gas such as silane ($SiH_4$) is rather low and the yield of the film formation stands low because of reaction products generated in a large amount during the film formation. Besides, it is also a serious problem that due to a high-temperature reaction, a considerable number of comparatively weak Si—H couplings are included in the formed film, which causes a dangling bond defect. The dangling bond has no connectors and forms a trap level of electrons to adversely affect film or transistor characteristics. Consequently, it is difficult to obtain a thin film transistor of which characteristics can be stable and hardly changeable with the passage of time.

To solve the problems involved in the conventional plasma-assisted CVD, there has been proposed an electron cyclotron resonance plasma enhanced CVD method which utilizes electron cyclotron resonance caused by the interaction between a microwave and a magnetic field. According to this method, a film can be formed at a comparatively low temperature as compared with a conventional plasma-assisted CVD method utilizing a chemical reaction at a high temperature. This, therefore, can eliminate the limitation in the materials of the substrate and the underlayers.

By way of example, Japanese Unexamined Patent Publications No. 62-71276 and No. 63-115328 have disclosed a microwave plasma enhanced CVD apparatus in which a magnetic field is generated by an electromagnetic coil in a plasma generating chamber provided separately from a film forming chamber for forming a thin film and a microwave is led into the plasma generating chamber through a magnetron to resonantly absorb electromagnetic energy into electrons in a static magnetic field and to generate a plasma in the plasma generating chamber. The thin film is formed on a substrate depending on the interaction between a gas to be fed into the film forming chamber and the plasma to be fed from the plasma generating chamber into the film forming chamber.

More specifically, in the microwave plasma enhanced CVD apparatus, the plasma which is generated in the plasma generating chamber, provided separately from the film forming chamber, is diffused through a small opening provided in a partition between the film forming chamber and the plasma generating chamber so as to be utilized as a radiation plasma. As a result, therefore, there is caused another problem that the area of the plasma which comes into contact with the substrate having a thin film is restricted and cannot be increased.

On the other hand, a gas for the desired thin film is fed into the film forming chamber through a nozzle or ring-shaped gas spouting port so as to be directed toward the radiation plasma which is diffused through the opening. FIG. 7 shows one form of a conventional microwave plasma, enhanced CVD apparatus, particularly showing a gas feeding configuration thereof as disclosed, for example, in Japanese Unexamined Patent Publication No. 63-43324. In FIG. 7, 3a designates a plasma generating chamber; 4 a magnetic field applying means; 5 a microwave introducing guide; 6a a feeding tube for plasma gas ; 6b a feeding tube for a gas for the thin film; and 7a a film forming chamber. The operation of the apparatus is similar to that mentioned above in connection with publication No. 62-71276 and No. 63-115328.

In general, when the film formation is made in a film forming chamber of a small volume and under a low pressure, for example, in an atmosphere of 0.5 mTorr or lower, the flow (arrow B in FIG. 7) of the gas for the thin film which is introduced through the tube 6b is, in many cases, a molecular flow. Therefore, the tube 6b may have a configuration of a nozzle or a ring gas jetting port to provide a uniform gas flow distribution.

FIGS. 8 (a) and 8 (b) show the results of an experiment conducted by the inventors of the present invention on the characteristics of the thin film formed when a gas for the thin film is introduced through the nozzle disposed in parallel with a substrate. The results show that the gas for the thin film is diffused towards the center of the substrate and has a distribution of deposition rate or film thickness as shown in FIG. 8 (a). There is also a distribution of resistivity of the film formed as can be seen from FIG. 8 (b). Thus, although the gas is diffused along with the plasma, a film thickness distribution and a film deposition rate are gradually decreased from an end of the substrate where the gas is fed. Consequently, it is difficult to form the thin film having uniform properties over the entire substrate. By this reason, the thin film having a desired uniformity cannot have a size larger than φ100 mm or so.

Thus, it is quite difficult to obtain a uniform thin film of a desired large size by a conventional microwave plasma enhanced CVD apparatus.

SUMMARY OF THE INVENTION

It is therefore an object of the present invention to provide a microwave plasma enhanced CVD method and apparatus in which the selection of materials of a substrate and underlayers is rarely limited and by which a thin film having uniform properties can be formed over a large area at a comparatively low temperature.

The present invention features a microwave plasma enhanced CVD method and apparatus comprising a microwave radiating guide in which a horn portion of its cross section is gradually increased, the area of an opening of the microwave radiating guide being greater than that of a region in which a film is to be formed.

The microwave plasma enhanced CVD apparatus according to the present invention will now be described.

A microwave having a specific wave length (for example, 2.45 GHz) is radiated on a space having a specific magnetic field. In this case, the microwave plasma enhanced CVD apparatus comprises a microwave radiating guide wherein the opening area of a portion on which a microwave is to be radiated is not smaller than the area of a region in which the film is to be formed. Accordingly, the microwave enters the entire region (a plasma generating section) in which a plasma in a film forming chamber is generated.

Almost simultaneously with the microwave entrance, a gas should be fed into the plasma generating section. In other words, the gas is fed over the entire opening of the microwave radiating guide through a gas introducing tube in the vicinity of an inner wall of the film forming chamber by gas supply means provided separately from the present apparatus. Then, the gas is fed into the plasma generating section at almost the same flow velocity distribution through gas spouting means. Thus, the opening is large-sized in a peripheral portion of a gas spouting plate and small-sized in a central portion thereof in consideration of the pressure and flow of the film forming chamber. Consequently, the gas is fed at almost the same flow velocity distribution.

Accordingly, a uniform plasma can be formed. The plasma is transferred to an object to be treated along the magnetic field so that a thin film having uniform properties can be deposited over the substantially large area of a face to be treated.

The thin film formed according to the present invention is applicable to provide a thin film transistor. The so formed thin film transistor comprises a gate insulation film which is formed under the condition that a temperature is low. The gate insulation film is of SiNxHy (x+y≦4) in which the ratio of an Si—H absorption integral strength a to an N—H absorption integral strength b in infrared absorption spectrum is not greater than 0.25. Therefore, Si—N and N—H coupling densities are sufficiently high. In addition, comparatively weak Si—H couplings, which cause dangling bonds to become an electronic trap level are substantially not included. Consequently, the thin film transistor comprising a film formed according to the present invention rarely changes with time.

According to the present invention, the microwave is expanded and radiated on the substantially large area by means of an electromagnetic horn which has a partition and a gas spouting plate provided therein. In addition, there is utilized a highly active plasma which exists in a space between the partition and the object to be treated (a glass substrate). Consequently, an extremely dense and uniform thin film can be formed in a region of about φ500 mm. The thin film has a desired stoichiometric composition and is excellent in electro-optic characteristics.

Further according to the present invention, it is not required to heat the object to be treated for the thin film formation. Therefore, it is possible to form a dense film which does not include, too many comparatively weak Si—H couplings. By this reason, if the thin film transistor is formed by using the thin film formed according to the present invention, it can hold its characteristics electrically and optically stable with the passage of time. Furthermore, when the thin film having a large area is used for providing transistors to be used in combination with a liquid crystal, a display having a large screen (about 20 inches) can be obtained.

DETAILED DESCRIPTION OF PREFERRED EMBODIMENTS

There will be described embodiments of the present invention with reference to the drawings.

Figure 1:
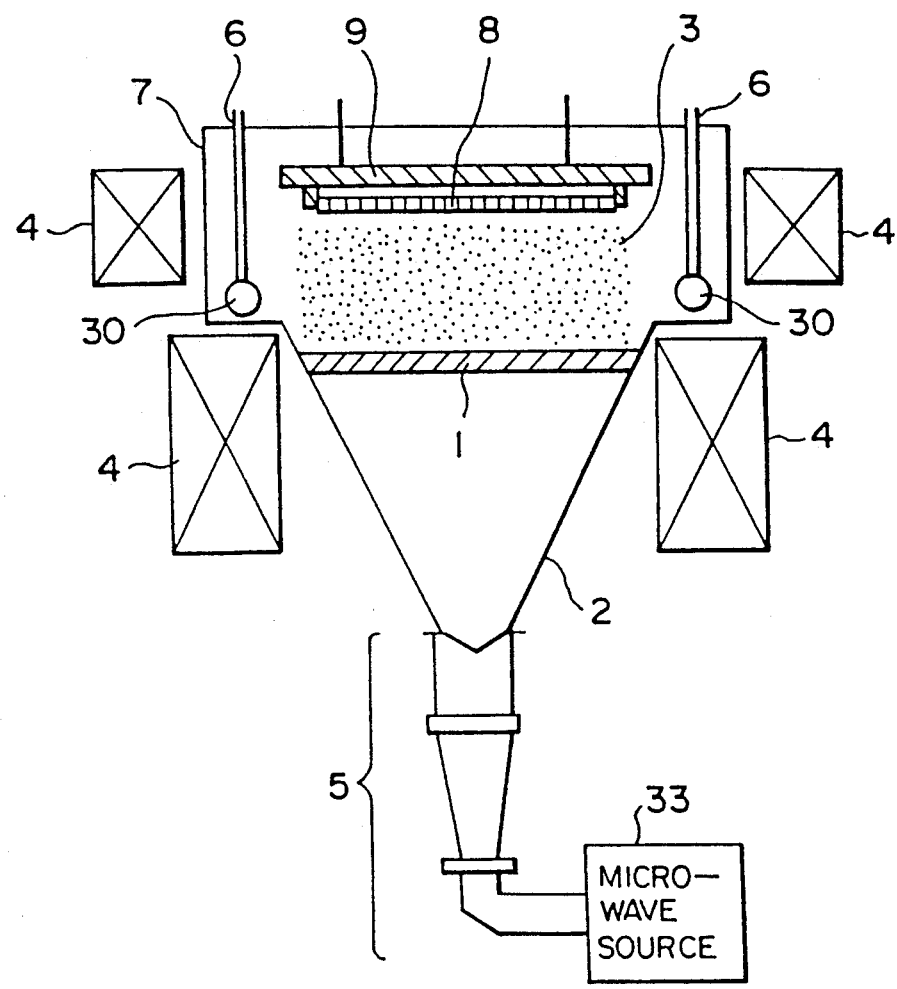
FIG. 1 is a schematic sectional view of one form of a microwave plasma enhanced CVD apparatus embodying the present invention.

A first embodiment of the present invention will be described with reference to FIG. 1.

The microwave plasma enhanced CVD apparatus basically comprises a microwave source 33 for generating a microwave, a microwave introducing guide 5 for propagating the generated microwave, an electromagnetic horn 2 which serves as a microwave radiating guide for propagating the microwave, while expanding and radiating the microwave on a substantially large area, a film forming chamber 7 connected to the electromagnetic horn 2 for generating a plasma to form a film therein, and magnetic field generators 4 provided outside the electromagnetic horn 2 and the film forming chamber 7, respectively.

The electromagnetic horn 2 has a partition 1 provided on a top portion thereof. The partition 1 is made of a material, which allows transmission of the microwave therethrough, such as a fused quartz, and spatially separates the film forming chamber 7 from the electromagnetic horn 2.

The film forming chamber 7 is provided with a gas introducing tube 6, through which a nitrogen gas or a nitrogen containing gas such as an ammonia gas and a silane gas as a metallic compound containing hydrogen are fed. The gas introducing tube 6 is connected to a ring-shaped gas feeding port 30. A number of holes for spouting the gas are provided on the inside of the gas feeding port 30. The film forming chamber 7 has a holder 9 for supporting a substrate 8 at a position opposite to the partition 1. An evacuation system for evacuating the inside of the electromagnetic horn 2 and the film forming chamber 7 (not shown) is also provided.

With this arrangement, a thin film is formed on the substrate 8. First, a mixed gas of a nitrogen gas with a silane gas is fed into a plasma generating section 3 through the gas introducing port 30. In addition, the microwave enters the plasma generating section 3 through the microwave introducing tube 5, and a magnetic field is generated by means of the magnetic field generator 4 to generate a plasma of the mixed gas and cause electron cyclotron resonance excitation.

The microwave is propagated through the electromagnetic horn 2 without disturbing a mode, is passed through the partition 1 and then enters the plasma generating section 3 at a substantially uniform radiation density. The electron cyclotron resonance occurs according to the interaction between the microwave and the magnetic field applied thereto. Thus, the plasma of a high density can be generated over the substantially large area in the plasma generating section 3.

According to the measurement conducted by the inventors, the plasma is uniformly formed at an electron density of about $10^{11}$ to $10^{12}$ cm$^{-3}$ over a substantial area as large as $\phi 500$ mm.

Active species of nitrogen and silane in the plasma are accelerated toward the substrate 8 placed in the film forming chamber 7, according to the magnetic field applied by the magnetic field generator 4. As a result, a thin silicon nitride film can be formed on the surface of the substrate 8 having a large diameter to have a uniform thickness and fine properties.

According to the present embodiment, the electron cyclotron resonance having a high density plasma is utilized. Consequently, even if the substrate is not heated, it is possible to form the thin silicon nitride film having optically or electrically good characteristics. The reason is that the thin film formed on condition of a low temperature has sufficiently high Si—N and N—H bonding concentrations and does not include many comparatively weak Si—H bondings, which cause a dangling bond defect in which there is effected an electron trap level.

Accordingly, if the so formed thin silicon nitride film is used as a gate insulation film of a thin film transistor, it is possible to control transistor characteristics with the movement of electrons, for example, to suppress the change of a threshold voltage with the passage of time.

In this connection, it is to be noted that the element bonding state of the thin film can easily be detected by a reflection infrared analysis method.

Figure 5:
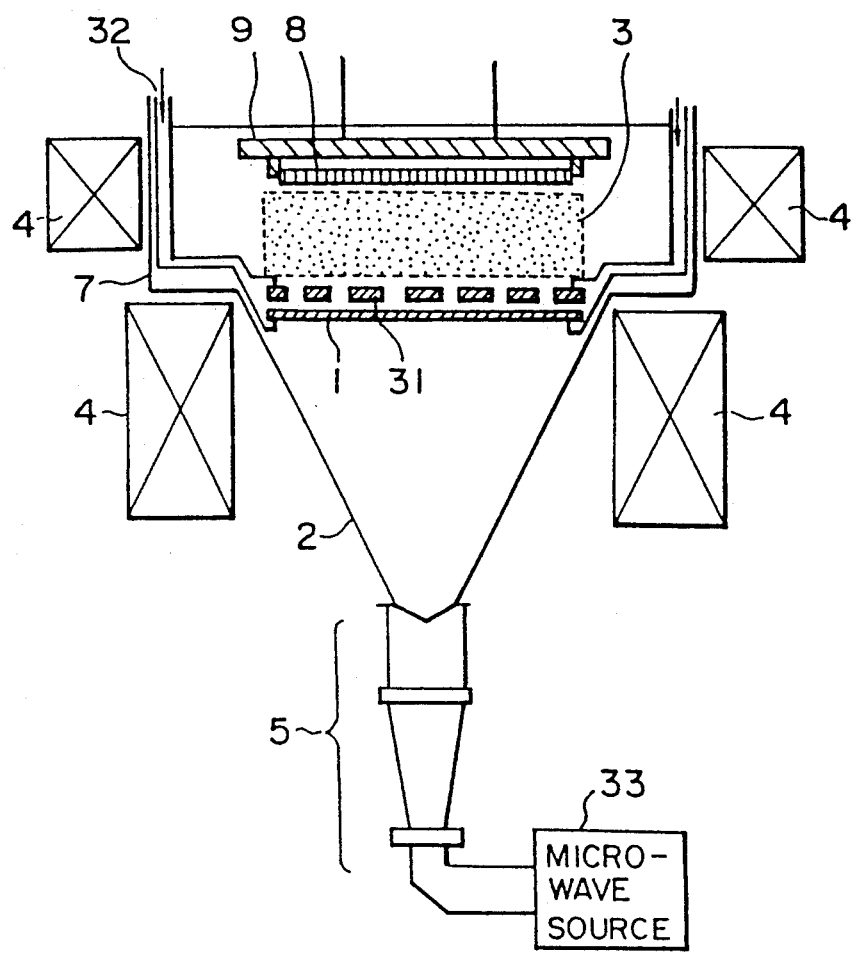
FIG.5 is a sectional view of a further form of a microwave plasma enhanced CVD apparatus according to the present invention.
Figure 6:
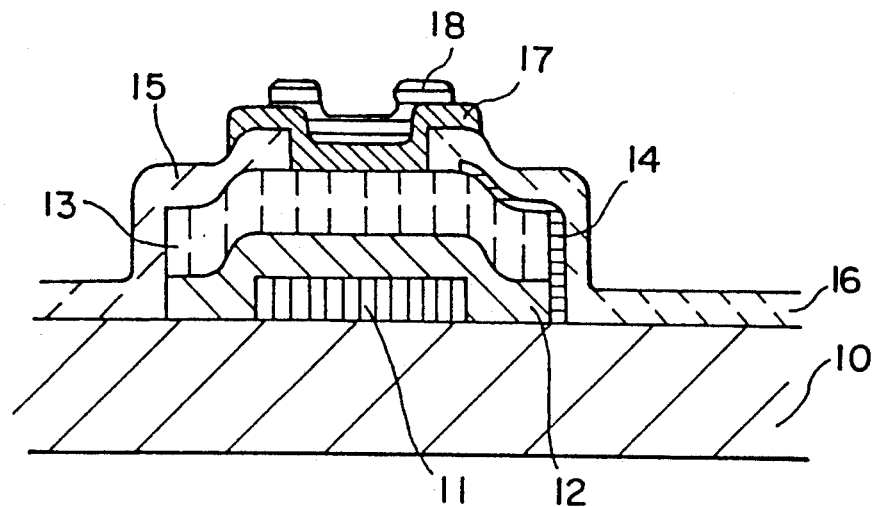
FIG. 6 is an enlarged sectional view of a conventional thin film transistor.
Figure 7:
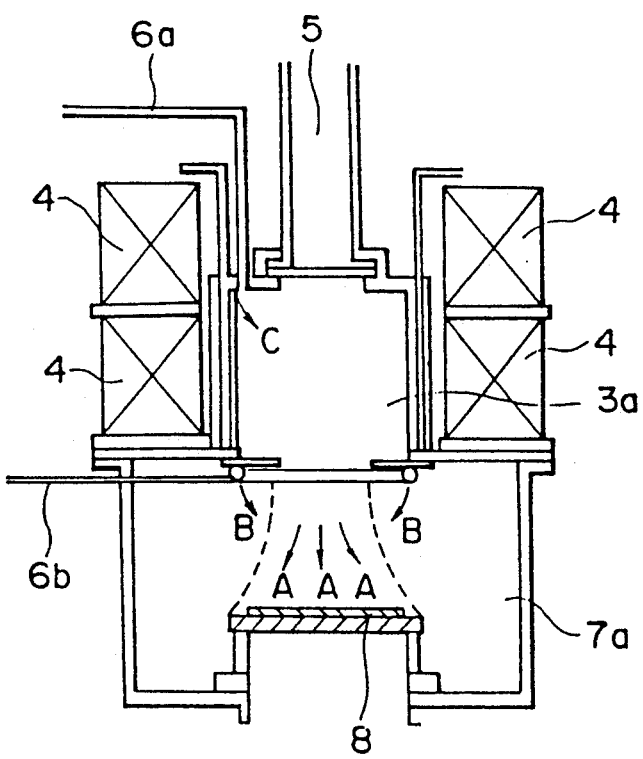
FIG. 7 is an example of a conventional microwave plasma enhanced CVD apparatus.
Figure 8A:
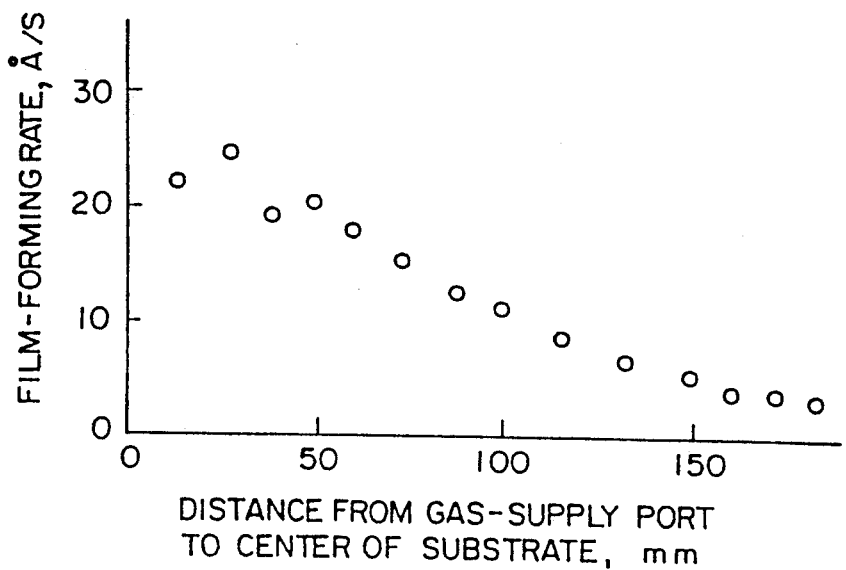
FIGS. 8 (a) and 8 (b) show illustrating characteristics of a film formed by using the conventional microwave plasma enhanced CVD apparatus.
Figure 8B:
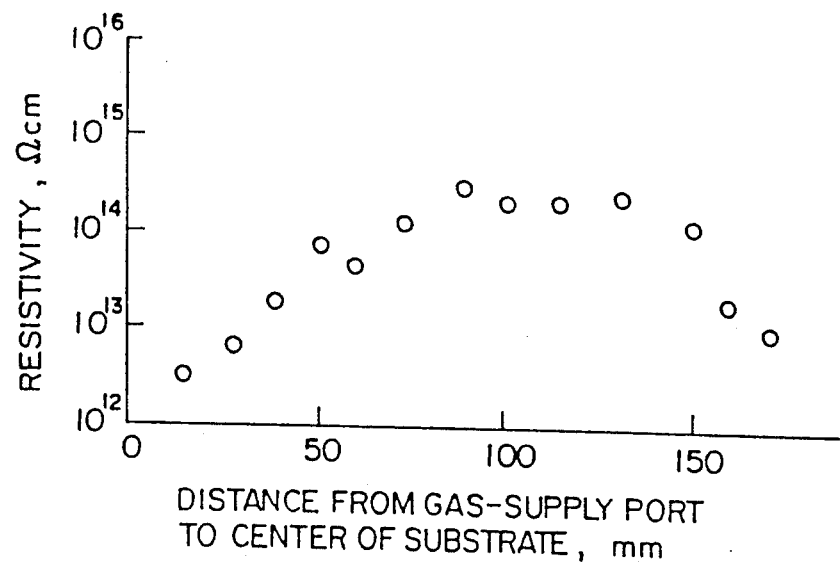

FIG.5 is a sectional view of another form of a microwave plasma enhanced CVD apparatus according to the present. A basic structure of the microwave plasma enhanced CVD apparatus of the present embodiment is similar to that of the microwave plasma enhanced CVD apparatus of the first embodiment. A difference between the two apparatuses lies in the means by which a gas into the plasma generating section.

Since a microwave source 33, an electromagnetic horn 2 and the like of the microwave plasma enhanced CVD apparatus of the present embodiment and their operation are similar to those of the first embodiment, the detailed description thereof is omitted here, and there will mainly be described the means for feeding a gas into the plasma generating section.

As shown in FIG.5, the means for feeding a gas into the plasma generating section 3 includes a gas feeder 32 and a gas spouting plate 31. The gas feeder 32 has two members which have different diameters and substantially cylindrical shapes. The two members are provided along an inner wall of a film forming chamber 7. The gas feeder 32 may alternatively be formed by duplicating the inner wall of the film forming chamber 7. Alternatively, a plurality of tubes may be arranged at proper spaces to form the gas feeder 32.

The gas spouting plate 31 is made of a material through which a microwave can be transmitted, and is provided on the partition 1 at a predetermined space from the partition 1. The gas spouting plate 31 has a lot of openings. The opening has a diameter of about 0.3 mm. In consideration of a pressure of the gas to be supplied when forming a film, it is preferred to adjust the number and diameters of the openings in such a manner that the gas is spouted out at a uniform flow velocity through the openings from the outer periphery of the gas spouting plate 31 to the center thereof. If the diameters of the openings are equal, the number of the openings is decreased in the vicinity of the outer periphery of the gas spouting plate 31 and increased in a portion apart from the outer periphery thereof. In other words, a conductance for gas flow is made different from an end of the partition 1 to a central portion thereof depending on the pressure and gas flow of the film forming chamber 7 at the time of film formation. In consideration of these circumstances, the number and diameters of the openings are to be adjusted.

It is desired that a space between the partition 1 and the gas spouting plate 31 not be longer than about 0.5 mm. If the space between the partition 1 and the gas spouting plate 31 is greater than about 0.5 mm, a plasma is generated between the partition 1 and the gas spouting plate 31 and a thin film is deposited on the openings of the gas spouting plate 31 to change the diameters thereof. Consequently, the gas is not uniformly spouted out. If the pressure of the space is made relatively lower than that of the film forming chamber 7, the plasma can be prevented from being generated in the space.

In place of the gas spouting plate 31, there may be used a plurality of pipes each of which has substantially the same inner diameter as that of the opening of the gas spouting plate 31 and substantially the same length as the thickness thereof.

The gas feeder 32 is connected to the gas spouting plate 3A in such a manner that all the gasses fed by the gas feeder 32 are supplied to the plasma generating section 3. It is preferred that the distance between the gas spouting plate 31 and the substrate 8 is 100 to 150 mm.

With this arrangement, it will be seen that when the gas is supplied at a constant pressure from the gas feeder 32 which is connected to the outer periphery of the gas spouting plate 31, the gas is spouted out at a uniform flow velocity distribution through a lot of openings provided on the gas spouting plate 31. If it is assumed that a plane parallel with the gas spouting plate 31 is in the plasma generating section 3, the gas having a constant flow is supplied to the plane. In other words, the gas, the flow of which is substantially constant, is supplied to the substrate 8 placed in parallel with the gas spouting plate 31.

In this connection, it is to be noted that if there is some nonuniformity in the density of the generated plasma, the partition may be arranged with reference to the substrate to be treated so that a distance from the substrate may be shorter in a portion where the plasma density is higher and the distance may be longer where the plasma density is lower.

Since the operation of the plasma generating section 3 is similar to that of the first embodiment, the detailed description is omitted here.

Collectively, FIGS. 3 (a) to 3 (d) show the results of an experiment on typical characteristics of a thin silicon nitride film formed by means of the microwave plasma enhanced CVD apparatus according to the second embodiment. The conditions of an experiment are as follows: the flow of nitrogen and silane is set to 10: 1, a pressure is set to 1 to 3 mTorr and a microwave output is set to 1 to 2 kW.

Individually, FIGS. 3 (a) to 3 (d) show thickness distribution characteristics, resistivity distribution characteristics, permittivity distribution characteristics and infrared absorption spectrum characteristics, respectively, which are obtained in the experiment where a transparent glass substrate is used as the substrate 8. In FIGS. 3 (a) to 3 (d), axes of ordinate show a thickness, a refractive index, a resistivity and an absorption coefficient, respectively. On the other hand, axes of abscissa show a distance from the center of the substrate in FIGS. 3 (a) to 3 (c) and an absorption strength in FIG. 3 (d). From the graphs, it is clear that the thin film has a uniform characteristic distribution radially from the center of the transparent glass substrate over an extremely large area. As seen from the infrared absorption spectrum characteristics, the thin film has sufficiently high Si—N and N—H bonding concentrations showing a desired stoichiometric composition and has a highly dense structure. The thin film does not have comparatively weak Si—H bonding which causes a dangling bond of a silicon to be generated when forming the film. The dangling bond has no connectors and forms a trap level of electrons to adversely affect film or transistor characteristics. Consequently, an atomic structure can be kept dense.

According to the present embodiment, it is seen that the ratio of the Si—H bonding to the N—H bonding in integral absorption strength is not greater than 0.1 according to the results of the experiment. When the ratio is not greater than 0.25, it is possible to control a change of the transistor characteristics with the passage of time which is caused with the movement of electrons when the thin film is used for the gate insulation film of the transistor.

Figure 2:
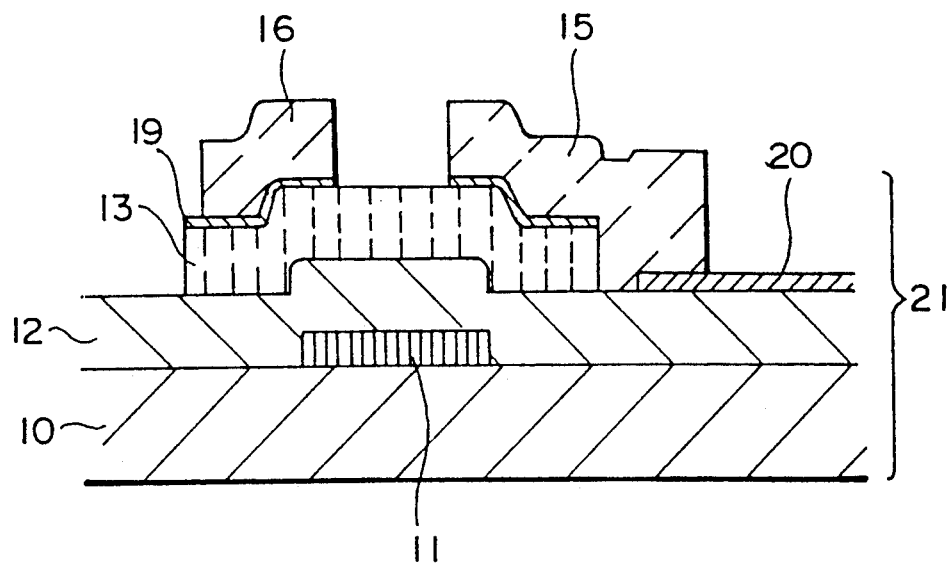
FIG. 2 is a sectional view of a thin film transistor having a thin film formed according to the present invention.
Figure 3A:
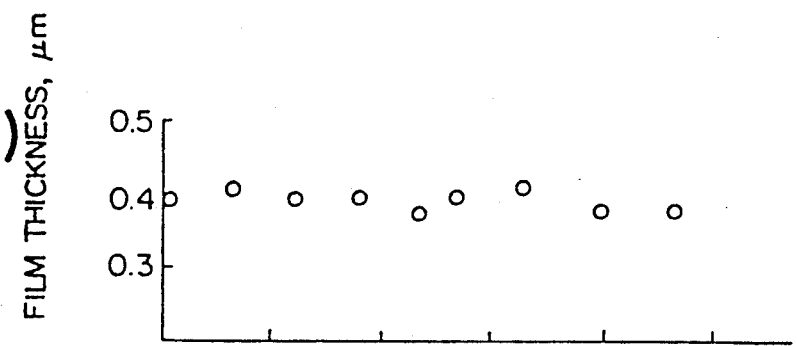
FIGS. 3 (a)-3 (d) show illustrating the results of an experiment on typical characteristics of a silicon nitride thin film formed by means of another form of a microwave plasma enhanced CVD apparatus according to the present invention.
Figure 3B:
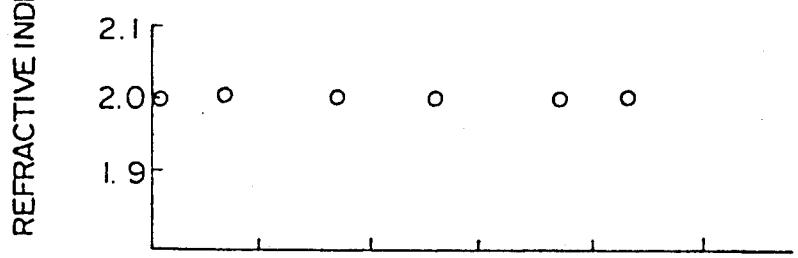
Figure 3C:
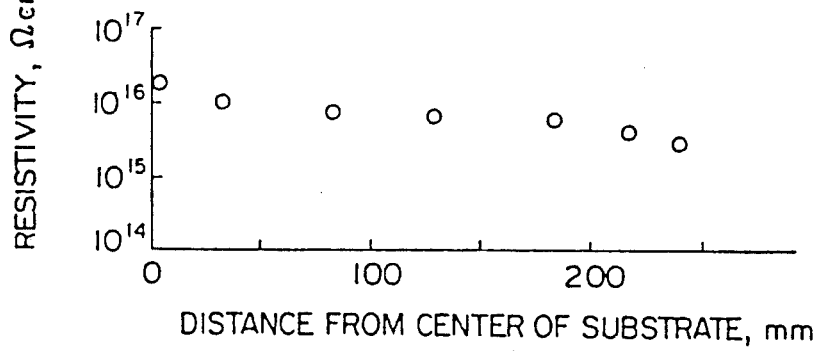
Figure 3D:
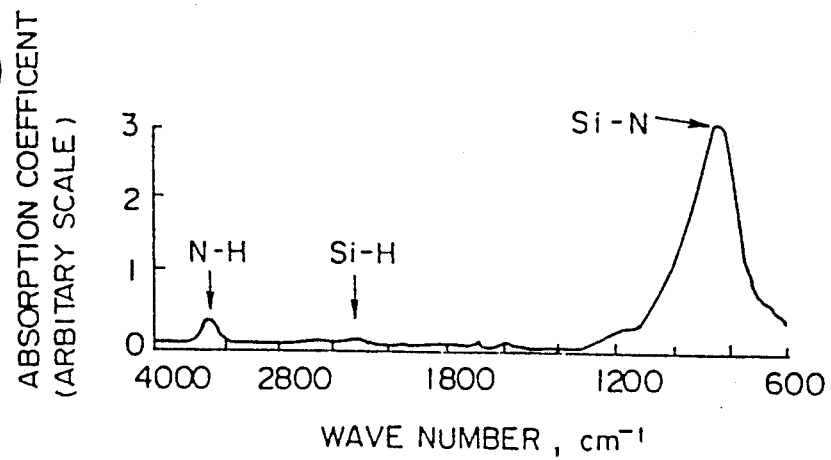

FIG. 2 shows, in section, a thin film transistor 21 using a thin film formed according to the present invention. The thin film transistor 21 comprises a gate electrode It formed in a desired position on a substrate 10, a gate insulation film 12 formed so as to cover the gate electrode 11 over a substantially large area on the substrate 10, an ITO film 20 formed in a desired position on the gate insulation film 12, an amorphous silicon i layer 13 formed on the gate insulation film 12 in the vicinity of the ITO film 20 and above the gate electrode 11, an amorphous silicon n+ layer 19 which is formed on the amorphous silicon i layer 13 and has an opening, a drain electrode 16 formed on a part of the amorphous silicon n+ layer 19, and a source electrode 15 formed so as to cover a part of the periphery of the amorphous silicon i layer 13 and amorphous silicon n+ layer 19 and cover a part of the periphery of the ITO film 20.

There will be described a method for manufacturing the thin film transistor 21. The transparent glass 10 having a refractive index of 1.52 is used for a substrate 8 and fixed to a holder 9. First, the gate electrode 11 made of metal such as Cr is formed in a desired position on the substrate 8 by a known sputtering method. Then, the gate insulation film 12 is formed.

A nitride silicon film is formed as the gate insulation film 12 by means of an electron cyclotron resonance plasma enhanced CVD apparatus shown in the second embodiment as illustrated in FIG. 5. The nitrogen gas and silane gas are fed from the gas feeder 32 shown. Then, a silane is decomposed in a nitrogen plasma and a thin silicon nitride film having a thickness of 3000 to 4000 Å is formed as the gate insulation film 12 on the gate electrode 11.

The supply of the nitrogen gas from the gas feeder 32 is stopped to consecutively form the amorphous silicon i and n+ layers 13 and 19 at thicknesses of 3000 to 4000 Å and 300 to 400 Å in predetermined regions, respectively. Phosphine (PH3) is supplied as a dopant of the amorphous silicon n+ layer 19 from the gas feeder 32. Then, the ITO film 20 is formed as a transparent electrode in a predetermined region by a known anodic oxidation method. Thereafter, a part of the amorphous silicon n+ layer 19 is removed by an etching method, and the drain and source electrodes 15 and 16 are formed of metal such as Al by vacuum evaporation method or the like. Thus, the thin film transistor can be provided.

As described above, the gate insulation film 12 is formed by means of the electron cyclotron resonance plasma enhanced CVD apparatus shown in the second embodiment. In other words, a plasma which is highly activated by the electron cyclotron resonance action is taken out with an energy which is properly adjusted by utilizing the magnetic field, and then is caused to collide with the surface of the substrate 8. The insulation film 12 is thus formed. Thus, a compound effect can be obtained by the high activity of the plasma and the collision of ions and electrons with the substrate at a limited strength. The compound effect causes surface treatment reaction such as thin film formation to be occurred efficiently. The surface treatment reaction can be occurred at a normal temperature. As a result of this, it is possible to control the change of the transistor characteristics with the passage of time which is caused with the movement of the electrons in the case where the thin film transistor is formed. Consequently, it is possible to obtain a thin film transistor, which can hold good electrical characteristics in a long term, by a method for forming a thin film by means of the plasma enhanced CVD apparatus according to the second embodiment.

Figure 4:
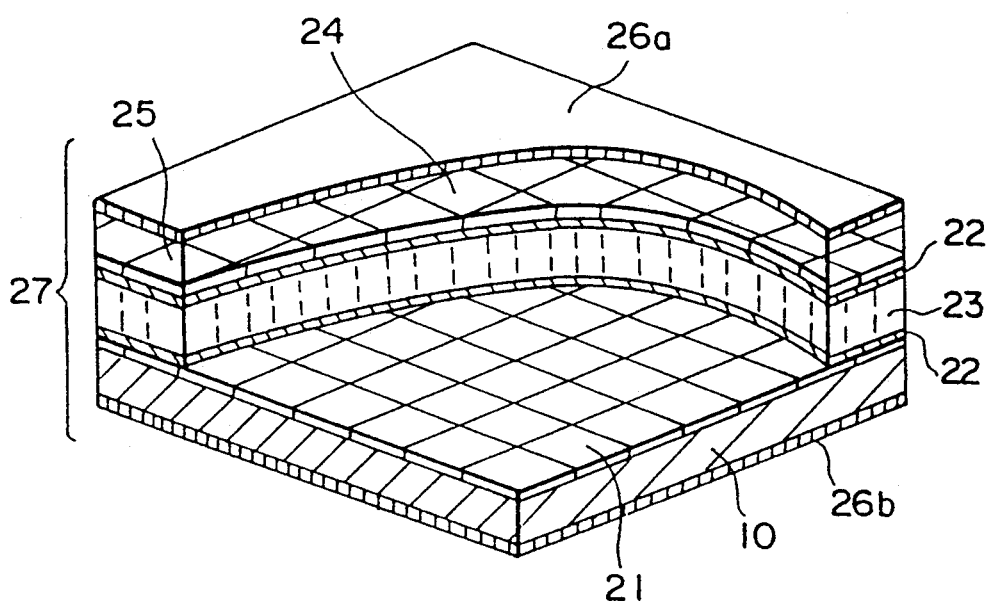
FIG. 4 is a partially cut away perspective view of a liquid crystal display employing a thin film formed according to the present invention.

FIG. 4 is a partially cut away perspective view of a liquid crystal display panel for a large screen display formed by combining a liquid crystal with the thin film transistor including the gate insulation film formed according to the present invention. The large screen display panel of the present embodiment is held between two polarizing plates 26a and 26b. The large screen display panel 27 has a structure in which a transparent glass 10, a thin film transistor 21, an electrode 22, a liquid crystal 23, a color filter 24, a surface protective glass 25 and a polarizing plate 26a are laminated in this order on the polarizing plate 26b by a known method.

In the large screen display panel 27, the size of a screen is determined by an area which is capable of having the thin film transistor 21 formed thereover. As described above, a plasma of material gases can be expanded by the electromagnetic horn provided in the microwave plasma enhanced CVD apparatus according to the present invention. Consequently, the thin film transistor 21 can be formed in an area of about $\phi 500$ mm. In other words, it is possible to form a display having the screen which has the size of about 20 inches.

What is claimed is:

1. A thin film transistor comprising a gate insulation film, the gate insulation film being SiNxHy ($x+y \leq 4$) in which the ratio of an Si—H absorption (2200 cm$^{-1}$) integral strength a to an N—H absorption (3340 cm$^{-1}$) integral strength b in infrared absorption spectrum is not greater than 0.25.

2. A thin film transistor according to claim 1, wherein a plurality of thin films are formed on a substrate, the thin film transistor further comprising:
   a gate electrode formed in a desired position on the substrate,
   said gate insulation film being formed over a sufficiently large area on the substrate so as to cover the gate electrode,
   an ITO film formed in a desired position on the gate insulation film,
   an amorphous silicon i layer formed on the gate insulation film in the vicinity of the ITO film and above the gate electrode,
   an amorphous silicon n+ layer which is formed on the amorphous silicon i layer and has an opening,
   a drain electrode formed on a part of the amorphous silicon n+ layer, and
   a source electrode formed so as to cover a part of the periphery of the amorphous silicon i and n+ layers and cover a part of the periphery of the ITO film.

3. A liquid crystal display wherein the thin film transistor according to claim 1 is used as a transistor for driving a liquid crystal.

* * * * *